United States Patent
German et al.

(10) Patent No.: US 7,905,995 B2
(45) Date of Patent: Mar. 15, 2011

(54) ALTERNATING CURRENT ROTATABLE SPUTTER CATHODE

(75) Inventors: John R. German, Prairie Du Sac, WI (US); Daniel T. Crowley, Owatonna, MN (US); Brian P. Meinke, Faribault, MN (US); Roger L. Peterson, New Hope, MN (US)

(73) Assignee: Applied Materials, Inc., Santa Clara, CA (US)

( * ) Notice: Subject to any disclaimer, the term of this patent is extended or adjusted under 35 U.S.C. 154(b) by 429 days.

(21) Appl. No.: 12/172,574

(22) Filed: Jul. 14, 2008

(65) Prior Publication Data
US 2008/0264786 A1    Oct. 30, 2008

Related U.S. Application Data

(63) Continuation of application No. 10/755,183, filed on Jan. 8, 2004, now Pat. No. 7,399,385, which is a continuation-in-part of application No. 09/881,555, filed on Jun. 14, 2001, now abandoned.

(51) Int. Cl.
*C23C 14/35* (2006.01)
(52) U.S. Cl. ......... 204/298.22; 204/298.21; 204/298.08
(58) Field of Classification Search .............. 204/298.2, 204/298.21, 298.22
See application file for complete search history.

(56) References Cited

U.S. PATENT DOCUMENTS

| | | |
|---|---|---|
| 4,166,018 A | 8/1979 | Chapin |
| 4,356,073 A | 10/1982 | McKelvey |
| 4,422,916 A | 12/1983 | McKelvey |
| 4,443,318 A | 4/1984 | McKelvey |
| 4,445,997 A | 5/1984 | McKelvey |
| 4,461,689 A | 7/1984 | McDiepers |
| 4,466,877 A | 8/1984 | McKelvey |
| 5,047,131 A | 9/1991 | Wolfe et al. |
| 5,096,562 A | 3/1992 | Boozenny et al. |
| 5,100,527 A | 3/1992 | Stevenson et al. |
| 5,188,717 A | 2/1993 | Broadbent et al. |
| 5,200,049 A | 4/1993 | Stevenson et al. |
| 5,345,129 A | 9/1994 | Molnar |
| 5,445,721 A | 8/1995 | Bower |
| 5,470,452 A | 11/1995 | Dickey et al. |
| 5,512,164 A | 4/1996 | Timberlake |
| 5,561,336 A | 10/1996 | Girardin |
| 5,567,289 A | 10/1996 | Taylor et al. |
| 5,661,353 A | 8/1997 | Erdman et al. |
| 5,814,195 A | 9/1998 | Lehan et al. |
| 6,328,856 B1 | 12/2001 | Brucker |
| 6,365,010 B1 | 4/2002 | Hollars |
| 6,841,051 B2 | 1/2005 | Crowley |
| 2002/0189939 A1 | 12/2002 | German et al. |

(Continued)

FOREIGN PATENT DOCUMENTS

EP    1584707 A1    10/2005
(Continued)

*Primary Examiner* — Rodney G McDonald
(74) *Attorney, Agent, or Firm* — Moser IP Law Group

(57) ABSTRACT

The present invention is an alternating current rotary sputter cathode in a vacuum chamber. The apparatus includes a housing containing a vacuum and a cathode disposed therein. A drive shaft is rotatably mounted in the bearing housing. A rotary vacuum seal is located in the bearing housing for sealing the drive shaft to the housing. An at least one electrical contact is disposed between a power source and the cathode for transmittal of an oscillating or fluctuating current to the cathode. The electrical contact between the power source and the cathode is disposed inside of the vacuum chamber, greatly reducing, and almost eliminating, the current induced heating of various bearing, seals, and other parts of the rotatably sputter cathode assembly.

15 Claims, 3 Drawing Sheets

U.S. PATENT DOCUMENTS

| | | |
|---|---|---|
| 2003/0099416 A1 | 5/2003 | Kinno et al. |
| 2003/0136672 A1 | 7/2003 | Barrett |
| 2003/0173217 A1 | 9/2003 | Crowley |
| 2005/0178662 A1 | 8/2005 | Wurczinger |
| 2005/0224343 A1 | 10/2005 | Newcomb et al. |

FOREIGN PATENT DOCUMENTS

| | | |
|---|---|---|
| JP | 01-215975 | 8/1989 |
| JP | 01305523 | 12/1989 |
| JP | 6-189506 | 7/1994 |
| JP | 2002220667 | 8/2002 |
| WO | 99/54911 A1 | 10/1999 |

ALTERNATING CURRENT ROTATABLE SPUTTER CATHODE

CROSS-REFERENCE TO RELATED APPLICATIONS

This application is a continuation of U.S. patent application Ser. No. 10/755,183, filed Jan. 8, 2004, issued as U.S. Pat. No. 7,399,385 on Jul. 15, 2008, which is a continuation in part of U.S. patent application Ser. No. 09/881,555, filed on Jun. 14, 2001, now abandoned, the contents of which are incorporated in their entirety by reference.

BACKGROUND OF THE INVENTION

1. Field of the Art

The present invention relates generally to a sputter cathode assembly and more particularly to a high current rotating sputter cathode assembly in which the power is supplied to the cathode at a point within the sputter chamber.

2. Description of the Prior Art

Direct current ("DC") reactive sputtering is often used for large area commercial coating applications, such as the application of thermal control coatings to architectural and automobile glazings. In this process, the articles to be coated are passed through a series of in-line vacuum chambers isolated from one another by vacuum locks. Such a system may be referred to as a continuous in-line system, or simply a glass coater.

Inside the chambers, a sputtering gas discharge is maintained at a partial vacuum pressure of about three millitorr. The sputtering gas comprises a mixture of an inert gas, such as argon, with a small proportion of a reactive gas, such as oxygen, for the formation of oxides.

Each chamber contains one or more cathodes held at a negative potential of about 200 to 1000 volts. The cathodes may be in the form of elongated rectangles, the length of which spans the width of the line of chambers. The cathodes are typically 0.10 to 0.30 meters wide and a meter or greater in length. A layer of material to be sputtered is applied to the cathode surface. The surface layer or material is known as the target or the target material. The reactive gas inside the chamber forms the appropriate compound with the target material.

Ions from the sputtering gas discharge are accelerated into the target and dislodge, or sputter off, atoms of the target material. These atoms, in turn, are deposited on a substrate, such as a glass sheet, passing beneath the target. The atoms react at the substrate surface or during passage from the target to the substrate with the reactive gas in the sputtering gas discharge to form a thin film.

The above glass coating process was made commercially feasible by the development of the magnetically-enhanced planar magnetron. This magnetron has an array of magnets arranged in the form of a closed loop and mounted in a fixed position behind the target. A magnetic field in the form of a closed loop is thus formed in front of the target plate. The field causes electrons from the discharge to be trapped in the field and travel in a spiral pattern, which creates a more intense ionization and higher sputtering rates. Appropriate water cooling may be provided to prevent overheating of the target. The planar magnetron is further described in U.S. Pat. No. 4,166,018 which is herein incorporated by reference for everything it teaches.

The rotary or rotating cylindrical magnetron was developed to overcome some of the problems inherent in the planar magnetron. The rotating magnetron uses a cylindrical cathode and target. The cathode and target are rotated continually over a magnetic array which defines the sputtering zone. As such, a new portion of the target is continually presented to the sputtering zone, which eases the cooling problem and allows higher operating powers to be utilized. The rotation of the cathode also insures that the target erosion zone comprises the entire circumference of the cathode covered by the sputtering zone. This increases target utilization. The rotating magnetron is described further in U.S. Pat. Nos. 4,356,073 and 4,422,916, the entire disclosures of which are hereby incorporated by reference.

The rotating magnetrons, while solving some problems, present others. Particularly troublesome has been the development of suitable apparatus for driving and supporting the magnetron in the coating chamber. Conventional rotating cathode bodies consist of a rotating cylinder supported within a fixed housing. The housing is connected with a vacuum chamber in which the sputtering process takes place. In order to maintain the integrity of the vacuum chamber, it is necessary to provide a seal between the rotating cathode body and the fixed housing. Vacuum and rotary water seals have been used to seal around a drive shaft and cooling conduits which extend between the coating chamber and the ambient environment. However, such seals have a tendency to develop leaks under conditions of high temperature and high mechanical loading. Various mounting, sealing, and driving arrangements for cylindrical magnetrons are described in U.S. Pat. Nos. 4,443,318; 4,445,997; and 4,466,877, the entire disclosures of which are hereby incorporated by reference. These patents describe rotating magnetrons mounted horizontally in a coating chamber and supported at both ends.

A preferred seal used to solve the above problems is one which uses a ferro-fluid to make the seal. This consists in part of a fluid suspension of microscopic-magnetic particles in a carrier liquid. The fluid is held in place by a magnetic field provided by an assembly of permanent magnets and steel.

Another troublesome sputtering problem has been an arcing phenomena, which is particularly troublesome in the DC reactive sputtering of silicon dioxide and similar materials such as aluminum oxide and zirconium oxide. As DC power, and therefore voltage, is increased, the charge on the rotating cathodesc tends to build up. Once the charge has built to a certain level, the charge will dissipate by arcing. Insulating materials like silicon dioxide are particularly useful to form high quality, precision optical coatings such as multilayer, antireflection coatings and multilayer, enhanced aluminum reflectors. In addition, when faster sputtering is desired, the power supplied must also be increased, resulting again in undesirable arcing.

Perturbation of the sputtering conditions due to arcing is especially detrimental to a cost effective operation, as any article being coated when an arc occurs will most likely be defective. For instance, the article may be contaminated by debris resulting from the arc, or it may have an area with incorrect film thickness caused by temporary disruption of the discharge conditions. Furthermore, the occurrence of arcs increases with operating time, and eventually reaches a level which requires that the system be shut down for cleaning and maintenance.

One way to avoid the problem of arcing is to avoid using a high DC current and instead to use fluctuating power sources, such as an alternating current ("AC") source or a square or pulsed DC power source. Oscillating current constantly switches the power supplied to the rotating member, as fast or faster than 50 KHz, constantly relieving the charge build up before it can cause an arc. Arcing is thereby minimized or eliminated.

Utilizing a fluctuating electrical current, however, gives rise to other types of problems. When the rotating cathodes are powered by an oscillating current power supply, any electrically conductive part near the path of the electrical current will be subject to heating via magnetic induction. This is generally not a problem at relatively low current. However, as frequency and/or current are increased, the rate of inductive heating becomes more and more significant and problematic. High frequency and current may be desired because some materials require a higher power density to be sputtered efficiently, such as when sputtering $TiO_2$, $SiO_2$ or $Al_2O_3$. Furthermore, to maintain the same power density over a long cathode requires more current, further exacerbating the heating problem. Finally, a higher current and frequency increases the overall sputter rate, and therefore the line speed, of the sputtering operation, resulting in a more efficient production rate.

The electrical induced heating effect is even more of a problem when ferro-fluid seals are used. Ferro-magnetic materials, like the seal, magnify the induced inductive heating effect by focusing the induced magnetic field within themselves. As the current and frequency of the oscillating power supply increases, the seal is heated. If the currency and frequency are high enough, the seal overheats and fails. This failure is usually catastrophic to the sputtering process and thus costly to manufacturing. Additionally, the inductive heating represents a waste of energy and thus reduced efficiency in the sputtering process.

Accordingly, there is a need in the art for an improved sputtering cathode assembly and process which minimizes or eliminates inductive heating when using an fluctuating power supply, thereby facilitating the use of higher oscillation frequencies and currents. This in turn facilitates the more efficient sputtering of materials which require high power densities, such as the reactive sputtering of $TiO_2$, $SiO_2$ and $Al_2O_3$, and significantly increases the sputter rate, and thus the line speed, of sputtering operations.

SUMMARY OF THE INVENTION

In contrast to the prior art, the present invention provides a method and apparatus for minimizing or eliminating the induction heating in an oscillating current sputter process, and thus facilitates the more efficient sputtering of materials requiring high power density. Furthermore, an increase in sputter rate and sputter line speed of all sputter processes may be achieved by using the present invention with oscillating power. More specifically, the present invention relates to an oscillating powered cathode assembly which minimizes, if not eliminates, inductive heating in the rotary seal, main bearings and other cathode parts, and an oscillating power sputter method for accomplishing the same.

The production of magnetically induced heating is accomplished in the present invention by providing the power connection to the rotating cathode in a manner which does not produce a magnetic field through the area where heating previously occurred; in other words, the inducted field in the region around the rotary seal is substantially eliminated. One specific embodiment for accomplishing this in accordance with the present invention is to feed the two power leads into the sputter chamber in close proximity to one another. Since each of the power leads has the current moving in the opposite direction, the magnetic fields of the two legs will cancel each other. A modification of this embodiment is to provide a coaxial power feed. The ends of the power leads, inside the sputter chamber, are connected with the rotating cathode. This can be accomplished by a variety of means including a conventional electrical brush assembly.

A further embodiment, however, provides a cathode assembly in which the power is routed through the cathode support housing itself. In this embodiment, it is necessary for the housing to be constructed of an electrically conductive material. It is also preferable, although not required, for this housing to be generally cylindrical. With this embodiment, any induced magnetic field inside the generally cylindrical housing or current path is eliminated. Thus, the ferro-fluid and other ferro-magnetic components within the housing are in a field free region and thus not subject to inductive heating.

Another embodiment of the present invention may comprise a cathode, a vacuum chamber surrounding at least a portion of said cathode, said vacuum chamber defined by a chamber housing connected and sealed relative to said cathode, a power supply which supplies a current to the cathode, and a power connection between said power supply and said cathode which allows the current to flow between the same, said power connection with said cathode being at a point within said vacuum chamber.

Another embodiment of the present invention may comprise a sputter chamber, one or more rotatable sputter cathodes with at least a portion of each of said cathodes positioned within said sputter chamber and a portion of said cathode disposed inside of a housing, and a rotary vacuum seal operably positioned between said cathode and said housing, means for supplying a current to the rotatably sputter cathode inside of the sputter chamber, thereby avoiding inductive heating of the vacuum seal.

Accordingly, it is an object of the present invention to provide a sputter cathode assembly using oscillating power with a reduction or elimination of inductive heating.

Another object of the present invention is to provide a rotating sputter cathode assembly capable of utilizing a high frequency and high current oscillating power source.

Another object of the present invention is to provide an oscillating powered rotating cathode assembly which can be used with a ferro-magnetic rotary seal.

A further object of the present invention is to provide an oscillating powered sputter cathode assembly in which the power is provided to the rotating cathode at a point within the sputter chamber.

A still further object of the present invention is to provide a method for sputtering in which the inductive heating of seals and other ferro-magnetic materials is substantially reduced or eliminated and which thereby facilitates the sputtering at high frequencies and currents.

These and other objects of the present invention will become apparent with reference to the drawings, the description of the preferred embodiment and the appended claims.

DETAILED DESCRIPTION

The present invention will be described in terms of a rotatable sputter cathode and more particularly a horizontally disposed cathode although this invention applies equally to vertically disposed cathodes. Further, the teachings of the present invention may be utilized in any type of sputter cathode, whether rotatable or not, that experiences current induced heating. Although the invention has application to cathodes using a DC power source, it has particular application to cathodes and sputtering processes driven by a fluctuating power source. This may include standard alternating current (AC), square or pulsed direct current and bipolar direct current, among others.

Figure 1:
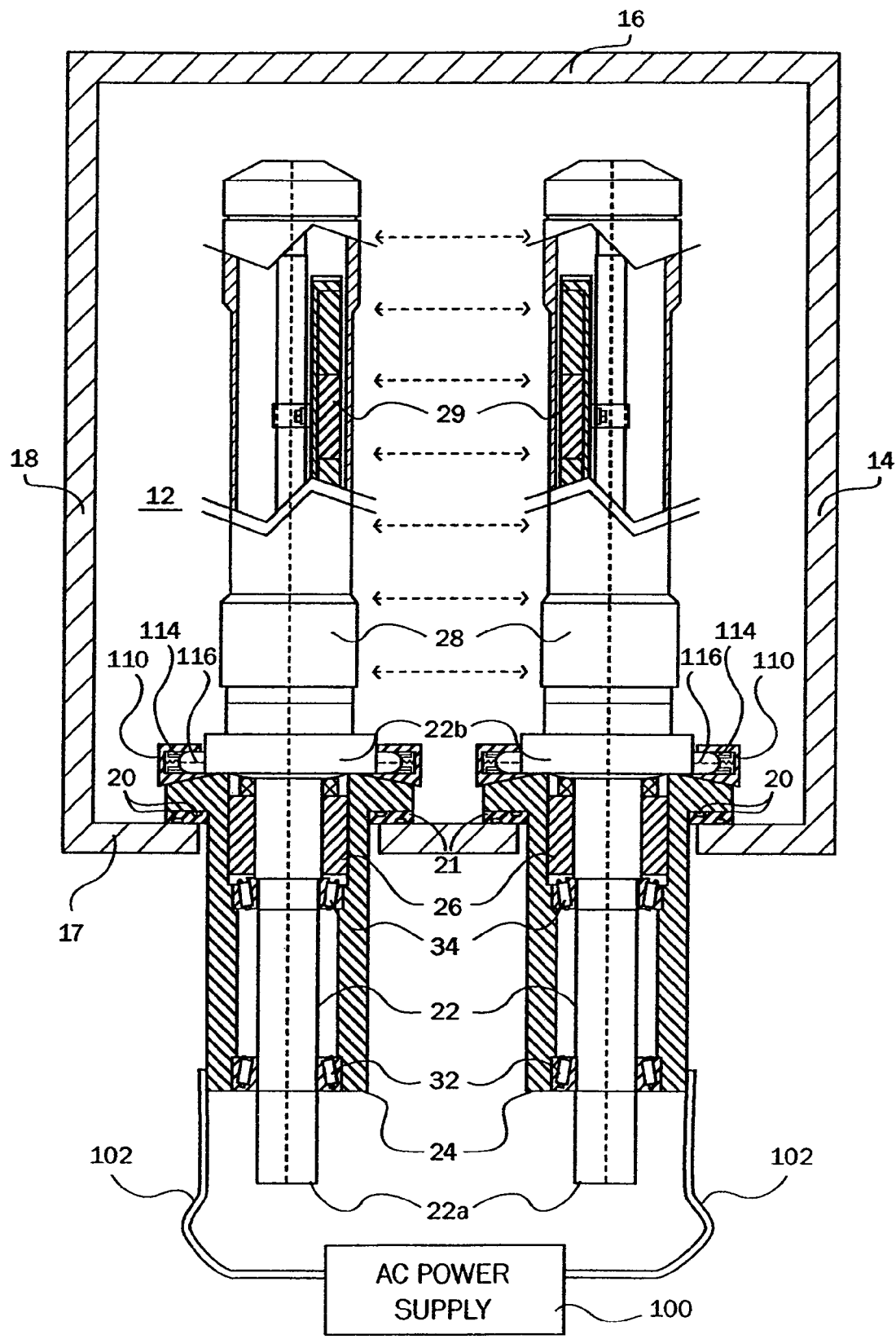
FIG. 1 is a top plan view of one embodiment of the present invention.

As shown in FIG. 1, the present embodiment is a cantilever mounting arrangement for a rotating sputter cathode 10 disposed in an evacuable coating or vacuum chamber 12. The coating chamber 12 may further comprise a floor 14, a side wall 16, a side wall 17, and a top wall 18 connected as illustrated in FIG. 1. The walls 14, 16, 17, and 18 may be formed as one unit or may be fitted and sealed together in any manner known to those skilled in the art. As is known in the art, the vacuum chamber 12 may further comprise a vacuum seal 20. The vacuum seal 20 may insure a positive seal between the normal atmospheric pressure outside the chamber 12 and the partial vacuum inside the chamber 12. This seal may be made of buna or Viton o-rings, or with other materials suitable for creating vacuum seals known to those skilled in the art. To electrically isolate the cathode from the chamber, an insulator 21 is placed between the two. This material can be any insulating material that is vacuum compatible, such as Nylon, Ultem, G-10, Teflon, etc. These materials with higher temperature rates are preferred.

The rotating cathode 10 of the present embodiment may be, by way of example, approximately 160 inches long and eleven inches in diameter at the housing flange 24. The actual magnetic array portion of such a cathode 10 that can be effectively utilized for sputtering may be approximately 124 inches in length.

As illustrated in FIG. 1, the present invention may further comprise a drive shaft 22, a drive shaft first end 22a, a main housing 24, a rotary vacuum seal 26, and a rotatable cathode target 28.

The drive shaft 22 of the present embodiment extends through the main housing 24 as illustrated in FIG. 1. A drive shaft first end 22a may extend outside of the main housing 24 and engage a drive mechanism. The rotary vacuum seal 26 may be operably situated between the drive shaft 22 and the main housing 26. The drive shaft 22 may be in a vacuum sealed relationship with the main housing 24 by operation of the rotary vacuum seal 26. The drive shaft 22 may be, by way of example, approximately seven inches in diameter at the flange end 22b.

Rotary vacuum seal 26 insures that the interior of main housing 24 and the outside atmosphere are both isolated from the vacuum chamber 12. Preferably, rotary seal 26 may be a ferrofluidic seal. As is known, a ferrofluidic seal incorporates a colloidal suspension of ultramicroscopic magnetic particles in a carrier liquid. A suitable ferrofluidic seal may be supplied by Ferrofluidic Corporation, 40 Simon Street, Nashua, N.Y. 03061. One compatible seal is Model #5C-3000-C. Other types of rotary seals for the shaft could also be employed without changing the nature and scope of the present invention. The rotary cathode target 28 is affixed to a second end 22b of the drive shaft 22. A magnet array 29 known to those skilled in the art to be suitable of cathode sputtering may be operably situated in the target.

As illustrated in FIG. 1, the present embodiment may further comprise a bearing 32, and a bearing 34. The bearing 32 and the bearing 34 insure the smooth rotation of the drive shaft 22 relative to the main housing 24. Utilizing two bearings 32 and 34 allows for the even distribution of the weight of the drive shaft 22 and further helps to insure the low friction rotation of shaft 22. The bearings 32 and 34 are thus spaced along drive shaft 22 to provide the cantilever support for sputter cathode 10. Specifically, the entire load of the magnetron may be supported by the bearings such that substantially no load may be transferred to vacuum seal 26. In alternative embodiments, bearings 32 and 34 may be included as a single or duplex bearing. In the present embodiment, bearings 32 and 34 may be tapered roller bearings. Other types of bearings may include conventional ball bearings, cylindrical roller bearings, and drawn-cup needle roller bearings.

A drive shaft pulley may be keyed to the drive shaft and positioned in such a way to rotate the same (not shown). The drive for cylindrical magnetron may be provided by means of an electric motor. The output of the motor may be transmitted through a reduction gearbox to a gearbox pulley which may be connected with the drive shaft pulley by a drive belt (not shown).

To shield certain parts from a dielectric coating build up which may cause arcing, alternative embodiments in an incorporated shield placed around parts of the cathode that are at cathode potential and that are not intended to be sputtered. This shield is called a dark space shield because it is spaced a length away from the cathode parts that creates a dark space. A dark space is simply an area where no plasma can exist. The cathode dark space length may be about 3 mm at a pressure of about 3 millitorr and a cathode potential of about 500 volts. A dark spaced shield keeps a plasma from forming at any unwanted point that is at cathode potential and it also keeps the dielectric from forming, therefore minimizing arc events. This shield can be at ground potential or it can 'float' at the surrounding plasma potential if it is not in electrical contact with anything else. See U.S. Pat. No. 5,567,289 for further description, the entire contents of which are herein incorporated by reference.

Figure 2:
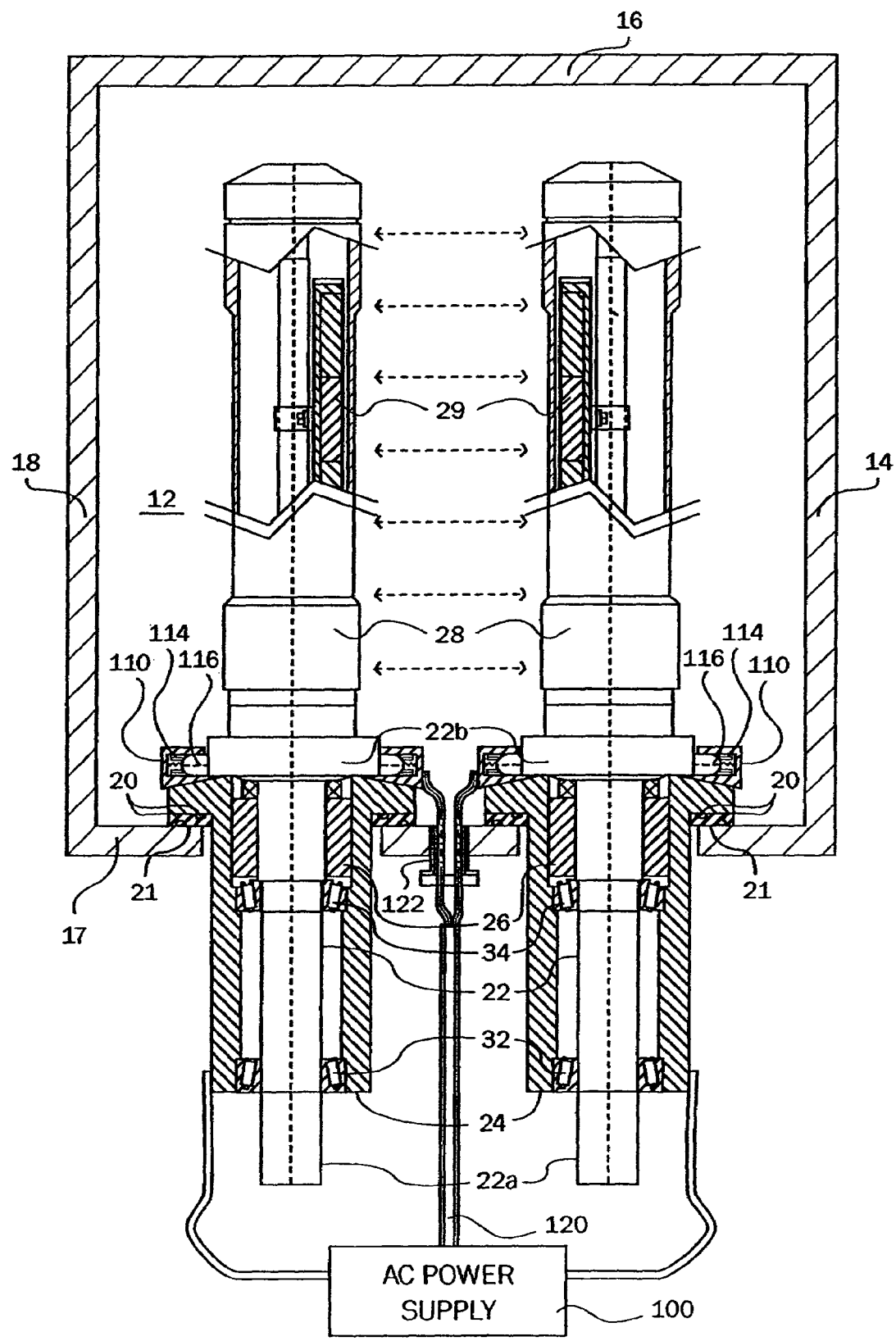
FIG. 2 is a top plan view of an alternative embodiment of the present invention.

The magnetic array 29 or bar may be disposed inside rotatable cathode target 28. As shown in FIGS. 1 and 2, the array 29 may be made up of a backing bar 29a to which rows of bar magnets 29b are attached. The array may be suspended from a cooling liquid input tube by a bracket 31.

As is illustrated in FIG. 1, the current of one embodiment of the present invention may be routed through the main housing 24 surrounding the drive shaft 22 of the rotatable sputter cathode. The electrical connection of this embodiment may further comprise a power supply 100, a first conductive wire 102, a brush housing 110 and electrical brushes 116 with leads 114. In the embodiment shown in FIG. 1, the power supply 100 may be connected to the first conductive wire 102, which is then bolted with a lug to the main housing 24. The brush housing 110 may be bolted to the main housing 24 on the inside of the vacuum chamber 12.

In the present embodiment, the current flows from the power supply 100, through the first conductive wire 102, and into the main housing 24. Once the current has entered the main housing 24, it flows along its length and enters the brush housing 110 and then through the brush leads 114 into the electrical brush 116. The brushes 116 transfer the current to the drive shaft flange 22b and then to the rotary cathode target 28. The main housing 24 should be manufactured of some electrically conductive substance that is also able to withstand the structural strains placed thereon. One material that may be utilized for the construction of the main housing 24 may be stainless steel, though those skilled in the art may likewise use other materials as well.

The brush housing 110 of the present invention may be operably attached to the main housing 24 and in electrical cooperation with the main housing 24 by directly bolting it to the main housing 24. The housing 110 may be constructed of a conductive material such as stainless steel, aluminum, copper, or other material well known to those reasonably skilled in the art.

The drive shaft flange 22b is bolted or otherwise connected to the cathode target 28. Thus, the target 28 receives the current from the flange 22b. In the present embodiment, the current flows into the brush housing 110 and then to the brush 116 itself through the brush leads 114. The brush 116 is in continuous electrical contact with the flange 22b and thus the rotary cathode 28 to provide a substantially continuous flow of current to the cathode. The power supply 100 of the present invention may be capable of providing any kind of current effective for sputtering. Preferably, the power supply 100 provide a fluctuating current that may include DC pulsed current, bipolar DC current, and standard alternating current (AC), among others.

Figure 3:
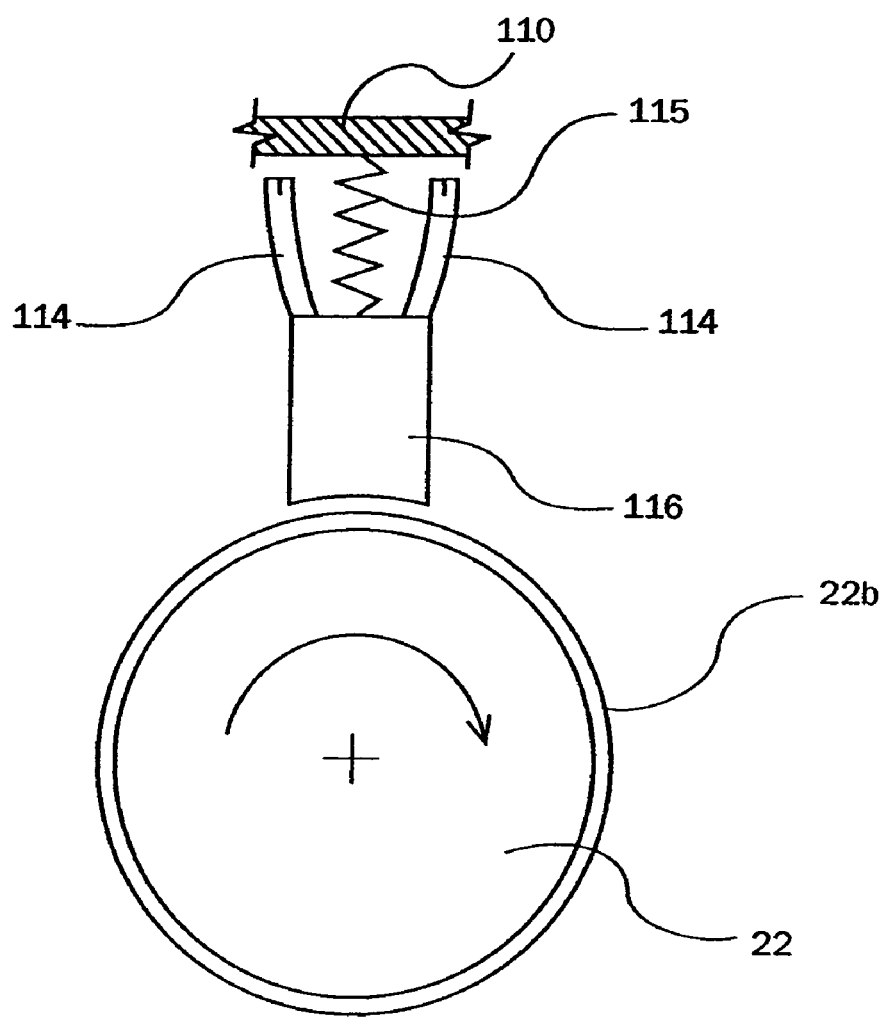
FIG. 3 is a schematic representation showing the electrical connection between the brush assembly and the cathode.

Reference is next made to FIG. 3 showing schematically the electrical connection between the brush or electrical connection assembly and the rotating cathode. As described above, the portion of the rotating cathode to which the driving current for the sputtering process is provided includes the drive shaft 22 and the drive shaft flange 22b. This drive shaft flange 22b may be in the form of, or include, a slip ring or other commutator to receive current from the brush 116. The brush 116 is part of the brush or electrical connection assembly which includes the brush housing 110, the brush leads 114 and the brush spring 115. The spring 115 is positioned between a portion of the housing 110 and the brush 116 and functions to bias the brush 116 toward engagement with the exterior surface of the flange or slip ring 22b. Although the schematic in FIG. 3 shows a single brush and brush assembly, the present invention contemplates that two or more brushes may be circumferentially positioned around the shaft 22 to increase the supply of current from the brushes 116 to the rotating cathode. Preferably at least two brush assemblies and as many as four or more brush assemblies are associated with each cathode shaft.

There are a variety of materials from which the member 22b and the brush 116 can be constructed. Preferably, however, the selected materials provide a low friction, current transferring engagement between the rotating element 22b and the stationary brush 116. Further, these materials should be selected so that the sliding engagement between them provides a high electrical conductivity transfer and a low voltage drop at the point of contact. Still further, the materials of these elements should be selected so that the generation of electrical noise, heat, and wear between such surfaces is kept to a minimum and the above objectives are achieved in a vacuum or substantial vacuum environment. Still further, it is preferable for the material of the brush 116 to be softer than the surface of the element 22b so that the brush 116, not the element 22b, is the chosen sacrificial element. Preferably, the materials are selected so that the wear rate of the brush 116 material will exceed the wear rate of the element 22b by a factor of at least 10.

The sliding surface of the rotating member which in the preferred embodiment is the outside surface of the element 22b should be selected from a material having high electrical conduction characteristics. This material should also be hard enough to withstand extended use with minimal wear and should, in combination with the brush material, minimize the voltage drop at the point of contact. Various metals or metal-based materials such as stainless steel, aluminum, copper, platinum, gold, silver and nickel, among others are preferred. Copper alloys which include low-melting materials such as lead, tin and antimony may also be used. Materials such as these belong to a family of materials commonly referred to as brasses and bronzes. Aluminum bronze is an example of an alloy which may be employed for application in the present invention.

The material from which the brush 116 is construed can be any one of a variety of carbon or graphite based materials. Examples of brushes which are made from such carbon or graphite based materials are brushes commonly referred to as electrographite brushes, graphite brushes, carbon-graphite brushes, resin-bonded brushes and metal-graphite brushes, hereinafter referred to as carbon or graphite based brushes. Various brush additives can be added to these carbon or graphite based materials to improve lubrication and thus brush wear in various environments. These additives may include materials such as molybdenum disulfide and other dichalcogenides including sulfides, diselenides and ditellurides of the metals molybdenum, tungsten, niobium and tantalum. Other materials which may be helpful include metallic halides including, among others $CdI_2$, $PbI_2$, $CdCl_2$, $HgI_2$, and $BaF_2$.

One preferred brush material is an electrographite, graphite, carbon-graphite, resin-bonded, or metal-graphite brush material (carbon or graphite based brush), to which has been added a small amount of molybdenum disulfide or other dichalcogenide. Dichalcogenides of particular interest for use as a brush material in the present invention are those identified above, namely, sulfides, diselenides and ditellurides of the metals molybdenum, tungsten, niobium, and tantlum. The most preferred of these is molybdenum disulfide ($MoS_2$). The most preferred brush material is a graphite brush made from natural or synthetic graphite with a small portion (preferably no more than about 10%) of molybdenum disulfide as an additive. More preferably, the brush material is constructed of a carbon or graphite based material having molybdenum disulfide present in an amount ranging from 1% to 10% by weight and most preferably ranging from 5 to 8% by weight.

The selected materials for the brush 116 and the element 22b should preferably provide electrical conductivity or current density of at least 50 amps per square inch and more preferably at least 80 amps per square inch.

A further preferred brush material is comprised of a combination of carbon, copper, barium and iron together with minor metallic impurities and gaseous elements such as nitrogen and oxygen. More specifically, a preferred brush material of this type comprises 40-60% carbon, 20-30% copper, 1-4% barium and 0.2-0.6% iron, with the remainder comprising minor metallic impurities and gaseous elements such as nitrogen and oxygen. A most preferred material of this type is comprised of 47% carbon, 25% copper, 2.2% barium and 0.39% iron.

As the current flows through the main housing 24 of the present embodiment, the current will flow along the surface of the housing itself. Since the current runs over the surface of the main housing 24, the field on the inside of the housing is zero. Since there is no electric field inside of the housing 24, there is no electric field induced heating of the ferrofluidic rotary seal 26.

In an alternative embodiment illustrated in FIG. 2, the electrical contact between the power source 100 and the rotary cathode target 28 may further comprise a conductive wire 120, a vacuum sealed electrical feed 122, and the same electrical contact assembly previously described. The conductive wire 120 may be operably attached to the power source 100 at one end and to the brush housing 110 at a second end. The wire 120 may travel through the vacuum chamber wall 16 via the vacuum sealed electrical feed 122. The vacuum sealed electrical feed 122 may be integrated into the vacuum chamber wall 17 of the vacuum chamber 12 as illustrated in FIG. 2. The brush housing 110 may be affixed to the main housing 24 and be in connected electrical cooperation with the cathode target 28. As will be appreciated by those skilled in the art, the vacuum sealed electrical feed 122 may be situated at any point on the vacuum chamber housing as long as it does not interfere with the operation of the other parts of the present invention rotatable sputter cathode. Furthermore, the electrical contact assembly may similarly be situated and affixed to any structure as long as it too does not interfere with the operation of the rotary sputter cathode that is the present invention.

In this embodiment, the current flows directly from the power supply 100, through the wire 120, and into the brush housing 110. From there the current is transferred through the brush leads 114, and brushes 116, to the drive shaft flange 226 and ultimately to the cathode target 28. Minimal electric field induced heating, if any, will occur along the length of the wire as the power and frequency level is increased, because the proximity of the electrical field generated by the two wires will cancel one another out.

In alternative embodiments, the electrical contact between the stationary housing 24 and the rotating target 28 may be comprised of a liquid contact. Liquid contacts of this nature may be comprised of a sealed liquid chamber in constant contact with a member attached around the surface of the cathode target 28. The seal prevents the liquid from escaping. The electric current may run through a housing similar to the brush housing 110 then through the fluid connection, and into the rotary cathode 28.

One advantage to the present invention is that it allows for the use of oscillating high current to effectuate sputtering. As previously mentioned, non-oscillating high current sputtering creates significant problems with arcing, damaging the object to be sputtered, and damaging the coating put on the surface. Switching to the oscillating current allows better sputtering by allowing a higher sputter rate without arcing. The present invention facilitates the high current sputtering to occur by bypassing the inductive heating of elements that are within or surrounding the current path. Eliminating inductive heating allows structures to be utilized near to the current path which are subject to induction. The information and examples described herein are for illustrative purposes and are not meant to exclude any derivations or alternative methods that are within the conceptual context of the invention. It is contemplated that various deviations can be made to this embodiment without deviating from the scope of the present invention. Accordingly, it is intended that the scope of the present invention be dictated by the appended claims rather than by the foregoing description of this embodiment.

The invention claimed is:

1. A rotary cathode assembly comprising:
    a rotary cathode having a cathode target and a rotatable drive shaft connectable to a drive mechanism, said rotary cathode being connected to said drive shaft for rotation therewith;
    a vacuum chamber surrounding at least a portion of said cathode, including said cathode target, said vacuum chamber defined in part by a chamber housing having first and second ends;
    a non-rotatable drive shaft housing connected in sealed relationship to said chamber housing and surrounding at least a portion of said rotatable drive shaft;
    a vacuum seal surrounding said drive shaft and positioned between said rotatable drive shaft and said non-rotatable drive shaft housing, said seal isolating the outside atmosphere from said vacuum chamber;
    a fluctuating current power supply located outside said vacuum chamber and having a power supply lead;
    a power connection contacting a portion of the drive shaft housing outside of the chamber housing and electrically engaging a portion of said cathode between said first and second ends of said chamber housing;
    a non-rotatable electrically conductive member electrically connecting said power supply lead and said power connection, said electrically conductive member extending past said vacuum seal in a direction substantially parallel to said drive shaft;
    wherein the electrically conductive member comprises a portion of the drive shaft housing.

2. The cathode assembly of claim 1 wherein said fluctuating current source is chosen from one or more of the group comprising an AC current source, a bipolar DC current source, and a pulsed DC current source.

3. The cathode assembly of claim 2 wherein said power connection further comprises at least one electrical contact assembly.

4. The cathode assembly of claim 3 wherein said at least one electrical contact assembly further comprises an electrical brush constructed of a carbon or graphite based material with molybdenum disulfide as an additive.

5. The cathode assembly of claim 1 including first and second rotary cathodes within said vacuum chamber, said first and second rotary cathodes having associated first and second drive shafts, first and second drive shaft housings and first and second vacuum seals between said first and second drive shafts and first and second drive shaft housings, respectively.

6. The cathode assembly of claim 5 wherein said fluctuating current power supply includes first and second power supply leads and the cathode assembly further includes first and second power connections electrically engaging portions of said first and second cathodes, respectively, between said first and second ends of said chamber housing and first and second non-rotatable electrically conductive members electrically connecting said first and second power supply leads to said first and second power connections, respectively.

7. The cathode assembly of claim 6 wherein said first and second electrically conductive members comprise a portion of said first and second drive shaft housings, respectively.

8. The cathode assembly of claim 7 wherein said first and second rotary cathodes are substantially parallel to one another.

9. The cathode assembly of claim 6 wherein said first and second electrically conductive members comprise first and second conductive wires substantially parallel to one another and closely adjacent to one another.

10. The cathode assembly of claim 9 wherein said first and second rotary cathodes are substantially parallel to one another.

11. The cathode assembly of claim 9 wherein said first and second conductive wires extend through a single sealed opening in said chamber housing.

12. The cathode assembly of claim 11 wherein said sealed opening is positioned between said first and second drive shaft housings.

13. The cathode assembly of claim 1 wherein said non-rotatable electrically conductive member is cylindrically shaped.

14. The cathode assemble of claim 13 wherein said vacuum seal has a generally cylindrical inner surface engaging said drive shaft and wherein said cylindrically shaped electrically conductive member is concentric with said cylindrical inner surface.

15. A rotary cathode assembly comprising:

a rotary cathode having a cathode target and a rotatable drive shaft connectable to a drive mechanism, said rotary cathode being connected to said drive shaft for rotation therewith;

a housing having a first portion defining a vacuum chamber housing and a second portion defining a drive shaft housing, said drive shaft housing surrounding at least a portion of said rotatable drive shaft;

a vacuum seal surrounding said drive shaft and positioned between said rotatable drive shaft and said drive shaft housing, said seal having a first end facing said vacuum chamber and a second, opposite end facing away from said vacuum chamber;

a fluctuating current power supply located outside said vacuum chamber and having a power supply lead;

a power connection contacting a portion of the drive shaft housing outside of the chamber housing and electrically engaging a portion of said cathode within said vacuum chamber housing;

a non-rotatable electrically conductive member electrically connecting said power supply lead and said power connection, said electrically conductive member extending past said vacuum seal in a direction substantially parallel to said drive shaft;

wherein the electrically conductive member comprises a portion of the drive shaft housing.

* * * * *